United States Patent [19]
Mizuniwa et al.

[11] Patent Number: 5,814,157
[45] Date of Patent: Sep. 29, 1998

[54] METHOD FOR CLEANING A SEMICONDUCTOR WAFER WITH AN IMPROVED CLEANING SOLUTION

[75] Inventors: Tetsuo Mizuniwa; Yoshimi Shiramizu, both of Tokyo, Japan

[73] Assignee: NEC Corporation, Tokyo, Japan

[21] Appl. No.: 645,812

[22] Filed: May 14, 1996

[30] Foreign Application Priority Data

May 15, 1995 [JP] Japan ................................. 7-140014

[51] Int. Cl.$^6$ ............................. C23G 1/02; B08B 3/08
[52] U.S. Cl. ................................. 134/1.2; 134/3; 134/41
[58] Field of Search ............................. 134/2, 3, 28, 41, 134/1.2

[56] References Cited

U.S. PATENT DOCUMENTS

| | | | |
|---|---|---|---|
| 4,050,954 | 9/1977 | Basi ............................................ | 134/2 |
| 5,143,103 | 9/1992 | Basso et al. ................................. | 134/1 |
| 5,286,657 | 2/1994 | Bran ............................................ | 134/1 |
| 5,382,296 | 1/1995 | Anttila ........................................ | 134/3 |
| 5,464,480 | 11/1995 | Matthews ................................... | 134/1.3 |
| 5,470,393 | 11/1995 | Fukazawa .................................. | 134/3 |
| 5,472,513 | 12/1995 | Shiramizu .................................. | 134/2 |

FOREIGN PATENT DOCUMENTS 58-100433   6/1983   Japan .

OTHER PUBLICATIONS

Kern et al., "Cleaning Solutions Based on Hydrogen Peroxide for Use in Silicon Semiconductor Technology", *RCA Review*, vol. 31, No. 2, Jun. 1970, pp. 187–205.

*Primary Examiner*—Jeffrey Snay
*Attorney, Agent, or Firm*—Young & Thompson

[57] ABSTRACT

A method for removing metallic and organic contaminations from a surface of a semiconductor wafer comprises cleaning the semiconductor wafer with a cleaning solution which contains a chlorine compound acting as an oxidant and which has a pH value in the range of 1 to 3. The cleaning solution has an oxidation-reduction potential in the range of 800 mV to 1200 mV when measured on the basis of a saturated calomel electrode at a temperature 25° C.

26 Claims, 2 Drawing Sheets

○ Oxidation-Reduction Potential at room temperatur ;
● Oxidation-Reduction Potential at 65°C ;
□ pH-value at room temperature ; and
■ pH-value at 65°C

METHOD FOR CLEANING A SEMICONDUCTOR WAFER WITH AN IMPROVED CLEANING SOLUTION

BACKGROUND OF THE INVENTION

The present invention relates to a method for cleaning a solid-state material and an improved cleaning solution used for cleaning the same, and more particularly to a method for removals of absorbed metallic and organic contaminations from a surface of a semiconductor wafer without use of any highly concentrated hydrochloric acid or hydrogen peroxide as reagents as well as moreover particularly to an improved cleaning solution used for both removals thereof and facilitation of treatment of cleaning solution waste.

In the conventional process for manufacturing LSIs, a cleaning of a surface of a semiconductor wafer has been carried out by an RCA cleaning method which is disclosed, for example, in W. Kern and D. A. Puotinen, RCA Review, vol. 81, pp. 187–205, June 1970. In accordance with the RCA cleaning method, the semiconductor wafer is immersed into either a water containing a concentrated ammonia or a solution prepared by mixing a concentrated hydrochloric acid, hydrogen peroxide and an ultrapure water, followed by rinsing the semiconductor wafer with an ultrapure water. In order to remove an absorbed metallic contamination from a surface of the semiconductor wafer, it is required to immerse the semiconductor wafer into a hot solution, in which the concentrated hydrochloric acid, hydrogen peroxide and the ultrapure water are mixed at a ratio by volume in the range of 1:1:6 to 1:1:4, followed by rinsing the semiconductor wafer with an ultrapure water. The use of this method can reduce a surface concentration of an absorbed metallic contaminant such as iron or copper down to not more than $1\times10^{10}$ atoms/cm$^2$ which is a low enough concentration to suppress any influence to property and performance of the LSIs.

In place of the above conventional RCA cleaning method, another conventional cleaning method was recently proposed, which is disclosed in the Japanese laid-open patent application No. 58-100433. In accordance with this conventional cleaning method, the cleaning is carried out by immersing the semiconductor wafer into a cleaning solution which has been prepared by blowing ozone into a hydrochloric acid solution in which the concentrated hydrochloric acid and the ultrapure water are mixed at a ratio by volume of about 1:4.

On the other hand, in order to remove particles or contaminations of ester or alcohol system from a surface of the semiconductor wafer, it is effective to immerse the semiconductor wafer into a hot solution having been prepared by mixing an ammonia water, a hydrogen peroxide containing water and an ultrapure water, followed by rinsing the same with a fresh ultrapure water. This method can not remove the organic contamination from the surface of the semiconductor wafer.

In order to remove the organic contamination from the surface of the semiconductor wafer, there has been carried Out a cleaning with use of a concentrated sulfuric acid system.

According to the foregoing, conventional cleaning methods use relatively large amounts of highly concentrated acids, alkali and hydrogen peroxide, for which reason a waste solution will necessarily contain the same. The highly concentrated acids, alkali and hydrogen peroxide contained in the waste solution are required to be properly treated by neutralization of acids or precipitation of those materials. These treatments require a large cost. The uses of the foregoing conventional cleaning methods may result in generation of a relatively large amount of sludge.

SUMMARY OF THE INVENTION

Accordingly, it is an object of the present invention to provide a method for cleaning a solid-state material free from any problems as described above.

It is a further object of the present invention to provide a method for cleaning a solid-state material, which results in a waste solution having a low concentration of reagents.

It is a still further object of the present invention to provide a method for removals of absorbed metallic and organic contaminations from a surface of a semiconductor wafer, which is free from any problems as described above.

It is a yet further object of the present invention to provide a method for removals of absorbed metallic and organic contaminations from a surface of a semiconductor wafer without use of highly concentrated reagents such as hydrochloric acid or hydrogen peroxide.

It is furthermore an object of the present invention to provide an improved cleaning solution used for cleaning a solid-state material, which is free from any problems as described above It is still another object of the present invention to provide an improved cleaning solution used for removals of absorbed metallic and organic contaminations from a surface of a semiconductor wafer without use of highly concentrated reagents such as hydrochloric acid or hydrogen peroxide.

It is moreover an object of the present invention to provide an improved cleaning solution used for removals of absorbed metallic and organic contaminations from a surface of a semiconductor wafer and facilitation of treatment of a cleaning solution waste.

The above and other objects, features and advantages of the present invention will be apparent from the following descriptions.

The present invention provides a method for cleaning a solid-state material. The method comprises a single step of contacting the solid-state material with a cleaning solution which contains a chlorine compound acting as an oxidant and which has a pH value in the range of 1 to 3. It is preferable that the cleaning solution has an oxidation-reduction potential in the range of 800 mV to 1200 mV when measured on the basis of a saturated calomel electrode at a temperature 25° C. It is also preferable that, before contacting the semiconductor wafer with the cleaning solution, the semiconductor wafer is previously contacted with a pre-cleaning solution which has a pH value in the range of 1 to 3.

The present invention further provides another method for remove of metallic and organic contaminations from a surface of a semiconductor wafer The method comprises the step of cleaning the semiconductor wafer with a cleaning solution which contains a chlorine compound acting as an oxidant and which has a pH value in the range of 1 to 3. It is preferable that the cleaning solution has an oxidation-reduction potential in the range of 800 mV to 1200 mV when measured on the basis of a saturated calomel electrode at a temperature 25° C. It is also preferable that, before contacting the semiconductor wafer with the cleaning solution, the semiconductor wafer is previously contacted with a pre-cleaning solution which has a pH value in the range of 1 to 3.

The present invention also provides an improved cleaning solution to be used for cleaning a solid-state material, wherein the cleaning solution contains chlorine compound acting as an oxidant and has a pH value in the range of 1 to 3. It is preferable that the cleaning solution has an oxidation-reduction potential in the range of 800 mV to 1200 mV when measured on the basis of a saturated calomel electrode at a temperature 25° C. It is also preferable that, before contacted the semiconductor wafer with the cleaning solution, the semiconductor wafer is previously contacted with a pre-cleaning solution which has a pH value in the range of 1 to 3.

The present invention further provides another improved cleaning solution used for removals of metallic and organic contaminations from a surface of a semiconductor wafer, wherein the cleaning solution contains chlorine compound acting as an oxidant and has a pH value in the range of 1 to 3. It is preferable that the cleaning solution has an oxidation-reduction potential in the range of 800 mV to 1200 mV when measured on the basis of a saturated calomel electrode at a temperature 25° C. It is also preferable that, before contacting the semiconductor wafer with the cleaning solution, the semiconductor wafer is previously contacted with a pre-cleaning solution which has a pH value in the range of 1 to 3.

BRIEF DESCRIPTION OF THE DRAWINGS

The present invention will be described with reference to the accompanying drawings in which.

DETAILED DESCRIPTION OF THE INVENTION

Figure 1:
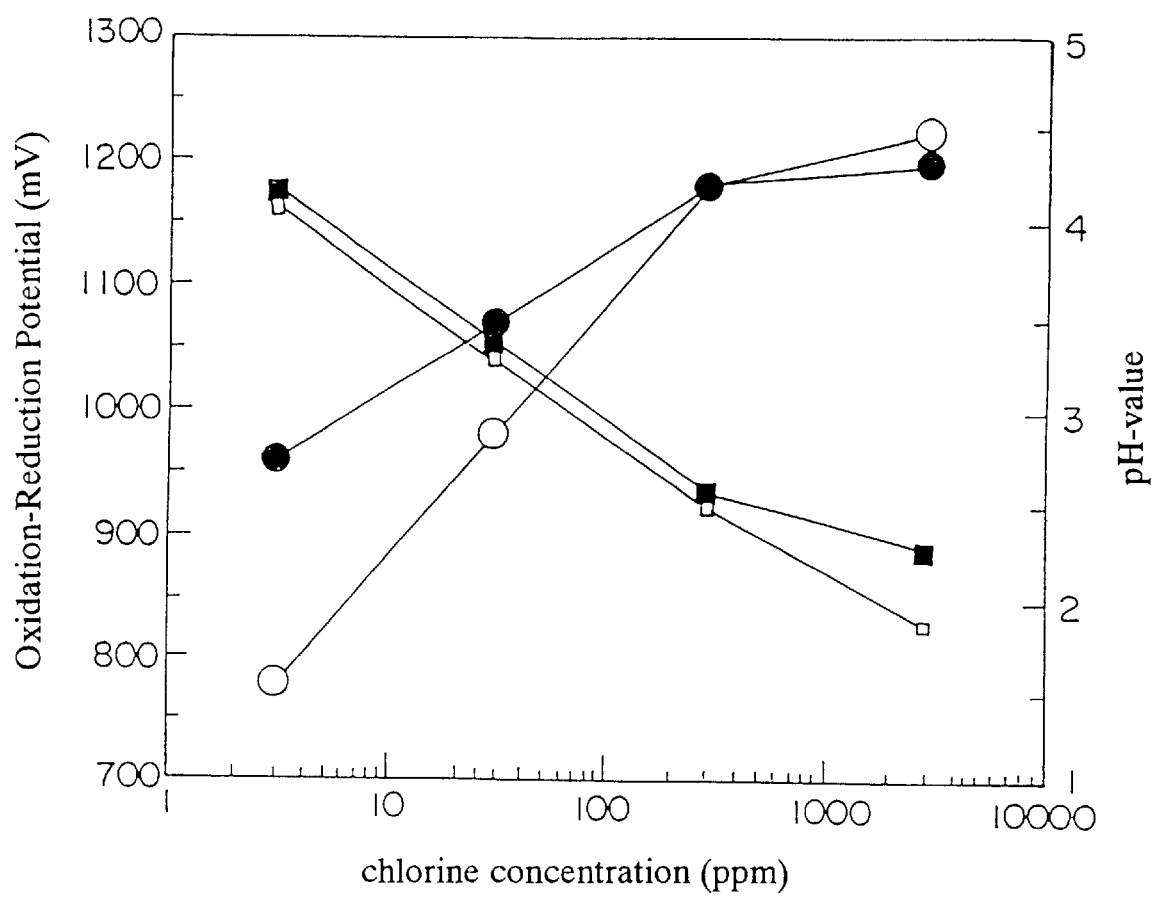
FIG. 1 is a diagram illustrative of variations both in oxidation-reduction potentials and in pH-values of an improved cleaning solution over chlorine concentration at room temperature and at 65° C. in accordance with the present invention.

The present invention provides a method for cleaning a solid-state material. The method comprises a single step of contacting the solid-state material into contact with a cleaning solution which contains a chlorine compound acting as an oxidant and which has a pH value in the range of 1 to 3. The oxidant of the chlorine compound promotes dissolution of metallic and organic contaminations by acid, thereby to allow a small amount of acid to show a sufficiently large dissolution power to remove organic and metallic contaminations from a surface of the solid-state material. If the pH-value of the cleaning solution is more than 3, it is difficult to remove metallic contaminations, particularly iron, from a surface of the solid-state material. If the pH-value of the cleaning solution is less than 1, the cleaning power of the cleaning solution is insufficient, thereby resulting in an increase in amount of reagent used.

The cleaning solution may be prepared by blowing ozone into a chloride ion containing solution. In this case, the chloride ion containing solution may advantageously be prepared by adding a chlorine acid into an ultrapure water. Further, the chlorine acid may optionally be added into the ultrapure water at a molar ratio of $1 \times 10^{-2}$ mol/liter, and the ozone may also optionally be blown into the chloride ion containing solution at 6 g/Nm$^3$ for about five minutes if iron or copper is adhered on a surface of the solid-state material, the cleaning solution can reduce the concentration of iron and copper to not more than 10 ppt.

The the cleaning solution may also be prepared by blowing a chlorine gas into an ultrapure water.

The cleaning solution may also be prepared by blowing a chlorine gas into an ultrapure water and subsequent dilution of pure water so that the concentration of chlorine is not less than 100 mg/liter in order to satisfy both conditions of an oxidation-reduction potential in the range of 800 mV to 1200 mV and a pH value in the range of 1 to 3.

The cleaning solution may also be prepared by dissolving an oxidant of chlorine system into an ultrapure water. In this case, the oxidant of chlorine system may, for example, be hypochlorite.

It is preferable that the cleaning solution has an oxidation-reduction potential in the range of 800 mV to 1200 mV when measured on the basis of a saturated calomel electrode at a temperature 25° C. It is more preferable that the oxidation-reduction potential is in the range of 1000 mV to 1200 mV. If the oxidation-reduction potential is less than 800 mV when measured on the basis of a saturated calomel electrode at a temperature 25° C., it is difficult to remove metallic contamination weakly ionized or organic contamination from a surface of the solid-state material. If the oxidation-reduction potential is more than 1200 mV when measured on the basis of a saturated calomel electrode at a temperature 25° C., an insufficient increase in cleaning power of the cleaning solution is obtained even when the oxidation-reduction potential is sufficiently high.

Moreover, it is conceivable that the cleaning solution further contains at least one of inorganic acids, a hydrochloric acid and a nitric acid, provided that the cleaning solution has a pH value in the range of 1 to 3.

Still more, the cleaning solution may have a temperature in the range of room temperature to 90° C., and the solid-state material may be immersed into the cleaning solution for 1 to 30 minutes.

In addition, the solid-state material may be immersed into the cleaning solution applied with an ultrasonic wave.

It is preferable that, before contacting the solid-state material with the cleaning solution, the solid-state material is previously contacted with a precleaning solution which has a pH value in the range of 1 to 3.

It is preferable that the above ultrapure water has an electric resistance of not less than 18M Ω.

Conditions such as time and temperature for contacting the solid-state material with the cleaning solution may be adopted with reference to the metallic and organic contamination adhered on the surface of the solid-state material. The solid-state material may be immersed into the cleaning solution. The time for contacting the solid-state material with the cleaning solution may be selected from the range of 1 to 30 minutes. The temperature of the cleaning solution is selected from the range of room temperature to about 90° C. In addition, one may apply ultrasonic wave to the cleaning solution to increase the cleaning power of the cleaning solution.

The surface of the solid-state material has a complex contamination of iron, copper and an organic substance, it is preferable to contact the solid-state material with a precleaning solution which has a pH value in the range of 1 to 3 for previous cleaning, before making the same with a cleaning, solution which contains the chlorine compound acting as an oxidant and which has a pH value in the range of 1 to 3. Iron is likely to be oxidized to generate ferric oxide, for which reason it is effective to remove the ferrous salt with the precleaning solution free of the chlorine compound acting as an oxidant before oxidation of iron.

In accordance with the present invention, the above cleaning solution, which contains the chlorine compound acting as an oxidant and which has a pH value in the range of 1 to 3, possesses a high removal capability of both the metallic and organic contaminations from the surface of the solid-state material. The above cleaning solution can reduce a concentration of the metallic and organic contaminations into a sufficiently low value for allowing the solid-state material to be free from any deterioration due to the presence of the contamination. The above cleaning solution can reduce the concentration into not more than $2\times10^9$ atoms/cm$^2$. By contrast, if the conventional cleaning solution containing a highly concentrated chlorine acid and hydrogen peroxide or the other conventional cleaning solution containing a highly concentrated chlorine acid and being blown with ozone, the concentration of the contamination adhered on the surface of the solid-state material is reduced to $1\times10^{10}$ atoms/cm$^2$, which is five times larger than the reduced concentration of the surface contamination obtained when the improved cleaning solution is used.

According to the present invention, it is possible to considerably reduce the amount of the reagent used for cleaning the solid-state material since the improved cleaning solution may be prepared by adding 8 liters of the ultrapure water with both 20 milliliters of a concentrated chlorine acid and 200 ml of a water containing of chlorine at 0.3% by weight. By contrast, the conventional cleaning solution was prepared by adding 6 liters of the ultrapure water with both 1 liter of a concentrated chlorine acid and 6 liters of hydrogen peroxide. These demonstrate that in the present invention it is possible to remarkably reduce the amount of the reagent used for cleaning the solid-state material.

Further, in accordance with the present invention, it is easy to treat the solution waste. If the conventional cleaning solution is used for cleaning the solid-state material, then the cleaning solution containing the highly concentrated chlorine acid and hydrogen peroxide is wasted. It is, therefore, required to carry out a neutralization of the acids or decomposition of those materials, for which reason it is necessary for treating the cleaning waste solution to use almost the same amount of the reagents as is used for cleaning the solid-state material. By contrast, in accordance with the present invention, the waste solution is an acid solution containing free chlorine, for which reason it is possible to decompose the free chlorine by an activated carbon and further possible to neutralize the waste solution with a small amount of alkyl to obtain a quality of water which may be released.

The present invention fir provides another method for removal of metallic and organic contaminations from a surface of a semiconductor wafer. The method comprises the step of cleaning the semiconductor wafer with a cleaning solution which contains a chlorine compound acting as an oxidant and which has a pH value in the range of 1 to 3. The oxidant of the chlorine compound promotes dissolution of metallic and organic contaminations by acid, thereby to allow a small amount of acid to show a sufficiently large dissolution power to remove organic and metallic contamination from the surface of the semiconductor wafer. If the pH-value of the cleaning solution is more than 3, it is difficult to remove metallic contaminations, particularly iron, from a surface of the semiconductor wafer. If the pH-value of the cleaning solution is less than 1, the cleaning power of the cleaning solution is insufficient, thereby resulting in an increase in amount of reagent used.

The cleaning solution may be prepared by blowing ozone into a chloride ion containing solution. In this case, the chloride ion containing solution may advantageously be prepared by adding a chlorine acid into an ultrapure water. Further, in this case, the chlorine acid may optionally be added into the ultrapure water at a molar ratio of $1\times10^{-2}$ mol/liter, and the ozone may also optionally be blown into the chloride ion containing solution at 6 g/Nm$^3$ for about five minutes. If iron or copper is adhered on a surface of the semiconductor wafer, the cleaning solution can reduce the concentration of iron and copper to not more than 10 ppt.

The cleaning solution may also be prepared by blowing a chlorine gas into an ultrapure water.

The cleaning solution may also be prepared by blowing a chlorine gas into an ultrapure water and subsequent dilution of pure water so that a concentration of chlorine is not less than 100 mg/liter in order to satisfy both conditions of an oxidation-reduction potential in the range of 800 mV to 1200 mV and the pH value in the range of 1 to 3.

The the cleaning solution is prepared by dissolving an oxidant of chlorine system into an ultrapure water. In this case, the oxidant of chlorine system may, for example, be hypochlorite.

It is preferable that the cleaning solution has an oxidation-reduction potential in the range of 800 mV to 1200 mV when measured on the basis of a saturated calomel electrode at a temperature 25° C. It is more preferable that the oxidation-reduction potential is in the range of 1000 mV to 1200 mV. If the oxidation-reduction potential is less than 800 mV when measured on the basis of a saturated calomel electrode at a temperature 25° C., it is difficult to remove metallic contamination weakly ionized or organic contamination from a surface of the semiconductor wafer. If the oxidation-reduction potential is more than 1200 mV when measured on the basis of a saturated calomel electrode at a temperature 25° C., an insufficient increase in cleaning power of the cleaning solution is obtained even the oxidation-reduction potential is sufficiently high.

Moreover, it is also conceivable that the cleaning solution further contains at least one of inorganic acids, a hydrochloric acid and a nitric acid, provided that the cleaning solution has a pH value in the range of 1 to 3.

Still more, the cleaning solution may have a temperature in the range of room temperature to 90° C., and wherein the semiconductor wafer is immersed into the cleaning solution for 1 to 30 minutes.

In addition, the semiconductor wafer may be immersed into the cleaning solution applied with an ultrasonic wave.

It is preferable that, before contacting the semiconductor wafer with the cleaning solution, the semiconductor wafer is previously contacted with a precleaning solution which has a pH value in the range of 1 to 3.

It is preferable that the above ultrapure water has an electric resistance of not less than 18M Ω.

Conditions such as time and temperature for contacting the solid-state material with the cleaning solution may be adopted with reference to the metallic and organic contamination adhered on the surface of the semiconductor wafer. The semiconductor wafer may be immersed into the cleaning solution. The time for contacting the solid-state material with the cleaning solution may be selected from the range of 1 to 30 minutes. The temperature of the cleaning solution is selected from the range of room temperature to about 90° C. In addition, one may apply ultrasonic wave to the cleaning solution to increase the cleaning power of the cleaning solution.

The surface of the semiconductor wafer has a complex contamination of iron, copper and an organic substance, it is preferable to contact the semiconductor wafer with a precleaning solution which has a pH value in the range of 1 to 3 for previous cleaning, before contacting the same with the cleaning solution which contains the chlorine compound acting as an oxidant and which has a pH value in the range of 1 to 3. Iron is likely to be oxidized to generate ferric oxide, for which reason it is effective to remove the ferrous salt with the precleaning solution free of the chlorine compound acting as an oxidant before oxidation of iron.

In accordance with the present invention, the above cleaning solution, which contains the chlorine compound acting as an oxidant and which has a pH value in the range of 1 to 3, possesses a high removal capability of both the metallic and organic contaminations from the surface of the semiconductor wafer. The above cleaning solution can reduce a, concentration of the metallic and organic contaminations into a sufficiently low value for allowing the semiconductor wafer to be fee from any deterioration due to the presence of the contamination. The above cleaning solution can reduce the concentration into not more than $2 \times 10^9$ atoms/cm$^2$. By contrast, if the conventional cleaning solution containing a highly concentrated chlorine acid and hydrogen peroxide or the other conventional cleaning solution containing a highly concentrated chlorine acid and being blown with ozone, the concentration of the contamination adhered on the surface of the semiconductor wafer is reduced to $1 \times 10^{10}$ atoms/cm$^2$, which is five time larger than the reduced concentration of the surface contamination obtained when the improved cleaning solution is used.

According to the present invention, it is possible to considerably reduce the amount of the reagent used for cleaning the semiconductor wafer since the improved cleaning solution may be prepared by adding 8 liters of the ultrapure water with both 20 milliliters of a concentrated chlorine acid and 200 ml of a water containing of chlorine at 0.3 % by weight. By contrast, the conventional cleaning solution was prepared by adding 6 liters of the ultrapure water with both 1 liter of a concentrated chlorine acid and 6 liters of hydrogen peroxide. These demonstrate that in the present invention it is possible to remarkably reduce the amount of the reagent used for cleaning the semiconductor wafer.

Further, in accordance with the present invention, it is easy to treat the waste solution. If the conventional cleaning solution is used for cleaning the semiconductor wafer, then the cleaning solution containing the highly concentrated chlorine acid and hydrogen peroxide is wasted. It is, therefore, required to carry out a neutralization of the acids or decomposition of those materials, for which reason it is necessary for treating the cleaning waste solution to use almost the same amount of the reagents as in used for cleaning the semiconductor wafer. By contrast, in accordance with the present invention, the waste solution is an acid solution containing free chlorine, for which reason it is possible to decompose the free chlorine by an activated carbon and further possible to neutralize the waste solution with a small amount of alkyl to obtain a quality of water which may be released.

The present invention also provides an improved cleaning solution to be used for cleaning a solid-state material, wherein the cleaning solution contains chlorine compound acting as an oxidant and has a pH value in the range of 1 to 3. The oxidant of the chlorine compound promotes dissolution of metallic and organic contaminations by acid, thereby to allow a sufficiently small amount of acid to show a sufficiently large dissolution power to remove organic and metallic contamination from the surface of the solid-state material. If the pH-value of the cleaning solution is more than 3, it is difficult to remove metallic contaminations, particularly iron, from a surface of the solid-state material. If the pH-value of the cleaning solution is less than 1, the cleaning power of the cleaning solution is insufficient, thereby resulting in an increase in amount of reagent used.

The cleaning solution may comprise a chloride ion containing solution having been blown with ozone. In this case, the chloride ion containing solution may comprise an ultrapure water added with a chlorine acid. Further, in this case, the chlorine acid may optionally be added into the ultrapure water at a molar ratio of $1 \times 10^{-2}$ mol/liter, and the ozone may also optionally be blown into the chloride ion containing solution at 6 g/Nm$^3$ for about five minutes. If iron or copper is adhered on a surface of the solid-state material, the cleaning solution can reduce the concentration of iron and copper to not more than 10 ppt.

The cleaning solution may have a concentration of chlorine component of not less than 100 mg/liter in order to satisfy both conditions of an oxidation-reduction potential in the range of 800 mV to 1200 mV and a pH value in the range of 1 to 3.

It is also conceivable that the cleaning solution may contain an oxidant of chlorine system dissolved into an ultrapure water. In this case, the oxidant of chlorine system may, for example, be hypochlorite.

It is preferable that the cleaning solution has an oxidation-reduction potential in the range of 800 mV to 1200 mV when measured on the basis of a saturated calomel electrode at a temperature 25° C. In this case, it is more preferable that the oxidation-reduction potential is in the range of 1000 mV to 1200 mV. If the oxidation-reduction potential is less than 800 mV when measured on the basis of a saturated calomel electrode at a temperature 25° C., it is difficult to remove metallic contamination weakly ionized or organic contamination from a surface of the solid-state material. If the oxidation-reduction potential is more than 1200 mV when measured on the basis of a saturated calomel electrode at a temperature 25° C., an insufficient increase in cleaning power of the cleaning solution is obtained even when the oxidation-reduction potential is sufficiently high.

Moreover, it is also conceivable that the cleaning solution further contains at least one of inorganic acids, a hydrochloric acid and a nitric acid, provided that the cleaning solution has a pH value in the range of 1 to 3.

It is preferable that the above ultrapure water has an electric resistance of not less than 18M Ω.

Conditions such as time and temperature for contacting the solid-state material with the cleaning solution may be adopted with reference to the metallic and organic contamination adhered on the surface of the solid-state material. The solid-state material may be immersed into the cleaning solution. The time for contacting the solid-state material with the cleaning solution may be selected from the range of 1 to 30 minutes. The temperature of the cleaning solution is selected from the range of room temperature to about 90° C. In addition, one may apply ultrasonic wave to the cleaning solution to increase the cleaning power of the cleaning solution.

The surface of the solid-state material has a complex contamination of iron, copper and an organic substance, it is preferable to contact the solid-state material with a precleaning solution which has a pH value in the range of 1 to 3 for previous cleaning, before contacting the same with a cleaning solution which contains the chlorine compound acting as an oxidant and which has a pH value in the range of 1 to 3 Iron is likely to be oxidized to generate ferric oxide, for which reason it is effective to remove the ferrous salt with the precleaning solution free of the chlorine compound acting as an oxidant before oxidation of iron.

In accordance with the present invention, the above cleaning solution, which contains the chlorine compound acting as an oxidant and which has a pH value in the range of 1 to 3, possesses a high removal capability of both the metallic and organic contaminations from the surface of the solid-state material. The above cleaning solution can reduce a concentration of the metallic and organic contaminations into a sufficiently low value for allowing the solid-state material to be free from any deterioration due to the presence of the contamination. The above cleaning solution can reduce the concentration into not more than $2\times10^9$ atoms/$cm^2$. By contrast, if the conventional cleaning solution containing a highly concentrated chlorine acid and hydrogen peroxide or the other conventional cleaning solution containing a highly concentrated chlorine acid and being blown with ozone, the concentration of the contamination adhered on the surface of the solid-state material is reduced to $1\times10^{10}$ atoms/$cm^2$, which is five times larger than the reduced concentration of the surface contamination obtained when the improved cleaning solution is used.

According to the present invention, it is possible to considerably reduce the amount of the reagent used for cleaning the solid-state material since the improved cleaning solution may be prepared by adding 8 liters of the ultrapure water with both 20 milliliters of a concentrated chlorine acid and 200 ml of a water containing of chlorine at 0.3% by weight. By contrast, the conventional cleaning solution was prepared by adding 6 liters of the ultrapure water with both 1 liter of a concentrated chlorine acid and 6 liters of hydrogen peroxide. These demonstrate that in the present invention it is possible to remarkably reduce the amount of the reagent used for cleaning the solid-state material.

Further, in accordance with the present invention, it is easy to treat the solution waste. If the conventional cleaning solution is used for cleaning the solid-state material, then the cleaning solution containing the highly concentrated chlorine acid and hydrogen peroxide is wasted. It is, therefore, required to carry out a neutralization of the acids or decomposition of those materials, for which reason it is necessary for treating the cleaning waste solution to use almost the same amount of the reagents as is used for cleaning the solid-state material. By contrast, in accordance with the present invention, the waste solution is an acid solution containing free chlorine, for which reason it is possible to decompose the free chlorine by an activated carbon and further possible to neutralize the waste solution with a small amount of alkyl to obtain a quality of water which may be released.

The present invention further provides another improved cleaning solution used for removals of metallic and organic contaminations from a surface of a semiconductor wafer, wherein the cleaning solution contains chlorine compound acting as an oxidant and has a pH value in the range of 1 to 3. The oxidant of the chlorine compound promotes dissolution of metallic and organic contaminations by acid, thereby to allow a small amount of acid to show a large enough dissolution power to remove organic and metallic contamination from a surface of the semiconductor wafer. If the pH-value of the cleaning solution is more than 3, it is difficult to remove metallic contaminations, particularly iron, from a surface of the semiconductor wafer. If the pH-value of the cleaning solution is less than 1, the cleaning power of the cleaning solution is insufficient, thereby resulting in an increase in amount of reagent used.

The cleaning solution may comprise a chloride ion containing solution having been blown with ozone. In this case, the chloride ion containing solution may comprise an ultrapure water added with a chlorine acid. In this case, the chlorine acid may optionally be added into the ultrapure water at a molar ratio of $1\times10^{-2}$ mol/liter, and the ozone may also optionally be blown into the chloride ion containing solution at 6 g/$Nm^3$ for about five minutes. If iron or copper is adhered on a surface of the semiconductor wafer, the cleaning solution can reduce the concentration of iron and copper to not more than 10 ppt.

The cleaning solution may have a concentration of chlorine component of not less than 100 mg/liter in order to satisfy both conditions of an oxidation-reduction potential in the range of 800 mV to 1200 mV and an pH value is in the range of 1 to 3.

It is also conceivable that the cleaning solution may contain an oxidant of chlorine system dissolved into an ultrapure water. In this case, the oxidant of chlorine system may, for example, be hypochlorite.

It is preferable that the cleaning solution has an oxidation-reduction potential in the range of 800 mV to 1200 mV when measured on the basis of a saturated calomel electrode at a temperature 25° C. In this case, it is more preferable that the oxidation-reduction potential is in the range of 1000 mV to 1200 mV. If the oxidation-reduction potential is less than 800 mV when measured on the basis of a saturated calomel electrode at a temperature 25° C., it is difficult to remove metallic contamination weakly ionized or organic contamination from a surface of the semiconductor wafer. If the oxidation-reduction potential is more than 1200 mV when measured on the basis of a saturated calomel electrode at a temperature 25° C., an insufficient increase in cleaning power of the cleaning solution is obtained even when the oxidation-reduction potential is sufficiently high.

Moreover, it is also conceivable that the cleaning solution further contains at least one of inorganic acids, a hydrochloric acid and a nitric acid, provided that the cleaning solution has a pH value in the range of 1 to 3.

It is preferable that the above ultrapure water has an electric resistance of not less than 18M Ω.

Conditions such as time and temperature for contacting the solid-state material with the cleaning solution may be adopted with reference to the metallic and organic contamination adhered on the surface of the semiconductor wafer. It is available to immerse the semiconductor wafer into the cleaning solution. The time for making the solid-state material into contact with the cleaning solution may be selected from the range of 1 to 30 minutes. The temperature of the cleaning solution is selected from the range of a room temperature to about 90° C. In addition, one may apply ultrasonic wave to the cleaning solution to increase the cleaning power of the cleaning solution.

The surface of the semiconductor wafer has a complex contamination of iron, copper and an organic substance, it is preferable to contact the semiconductor wafer with a pre-cleaning solution which has a pH value in the range of 1 to 3 for previous cleaning, before contacting the same a cleaning solution which contains the chlorine compound acting as an oxidant and which has a pH value in the range of 1 to 3. Iron is likely to be oxidized to generate ferric oxide, for which reason it is effective to remove the ferrous salt with the precleaning solution free of the chlorine compound acting as an oxidant before oxidation of iron.

In accordance with the present invention, the above cleaning solution, which contains the chlorine compound acting as an oxidant and which has a pH value in the range of 1 to 3, possesses a high removal capability of both the metallic and organic contaminations from the surface of the semiconductor wafer. The above cleaning solution can reduce a concentration of the metallic and organic contaminations into a sufficiently low value for allowing the semiconductor wafer to be free from any deterioration due to the presence of the contamination. The above cleaning solution can reduce the concentration into not more than $2\times10^9$ atoms/cm$^2$. By contrast, if the conventional cleaning solution containing a highly concentrated chlorine acid and hydrogen peroxide or the other conventional cleaning solution containing a highly concentrated chlorine acid and being blown with ozone, the concentration of the contamination adhered on the surface of the semiconductor wafer is reduced to $1\times10^{10}$ atoms/cm$^2$, which is five times larger than the reduced concentration of the surface contamination obtained when the improved cleaning solution is used.

According to the present invention, it is possible to considerably reduce the amount of the reagent used for cleaning the semiconductor wafer since the improved cleaning solution may be prepared by adding 8 liters of the ultrapure water with both 20 milliliters of a concentrated chlorine acid and 200 ml of a water containing of chlorine at 0.3% by weight. By contrast, the conventional cleaning solution was prepared by adding 6 liters of the ultrapure water with both 1 liter of a concentrated chlorine acid and 6 liters of hydrogen peroxide. These demonstrate that in the present invention it is possible to remarkably reduce the amount of the reagent used for cleaning the semiconductor wafer.

Further, in accordance with the present invention, it is easy to treat the solution waste. If the conventional cleaning solution is used for cleaning the semiconductor wafer, then the cleaning solution containing the highly concentrated chlorine acid and hydrogen peroxide is wasted. It is, therefore, required to carry out a neutralization of the acids or decomposition of those materials, for which reason it is necessary for treating the cleaning waste solution to use almost the same amount of the reagents as is used for cleaning the semiconductor wafer. By contrast, in accordance with the present invention, the waste solution is an acid solution containing free chlorine, for which reason it is possible to decompose the free chlorine by an activated carbon and further possible to neutralize the waste solution with a small amount of alkyl to obtain a quality of water which may be released.

The above present invention is applicable not only to the semiconductor wafer but also to any solid-state material or device.

Whereas modifications of the present invention will be apparent to a person having ordinary skill in the art, to which the invention pertains, it is to be understood that examples to be described and shown hereafter by illustrations are by no means intended to be considered in a limiting sense. Accordingly, it is to be intended to cover by claims all modifications which fall within the spirit and scope of the present invention.

EXAMPLES

Example 1

Ultrapure water was added with various amounts of a commercially available reagent of a water containing chlorine at 0.3% by weight in order to prepare an acidic cleaning solution containing a chlorine compound acting as an oxidant. Of the cleaning solutions prepared by additions of various amounts of the chlorine-containing water, oxidation-reduction potential and pH-value were measured at room temperature and 65° C. There was confirmed variations in oxidation-reduction potential and pH-value of the cleaning solution prepared over concentration of chlorine added as illustrated in FIG. 1. The oxidation-reduction potential of the cleaning solution is raised as the concentration of chlorine in the chlorine-containing water is increased, whilst the pH-value of the cleaning solution is dropped as the concentration of chlorine in the chlorine-containing water is increased. FIG. 1 demonstrates that if the concentration of chlorine is not less than 100 mg/l, then both conditions that the pH value is in the range of 1 to 3 and that the oxidation-reduction potential is in the range of 1000 mV to 1200 mV are satisfied.

Example 2

Figure 2:
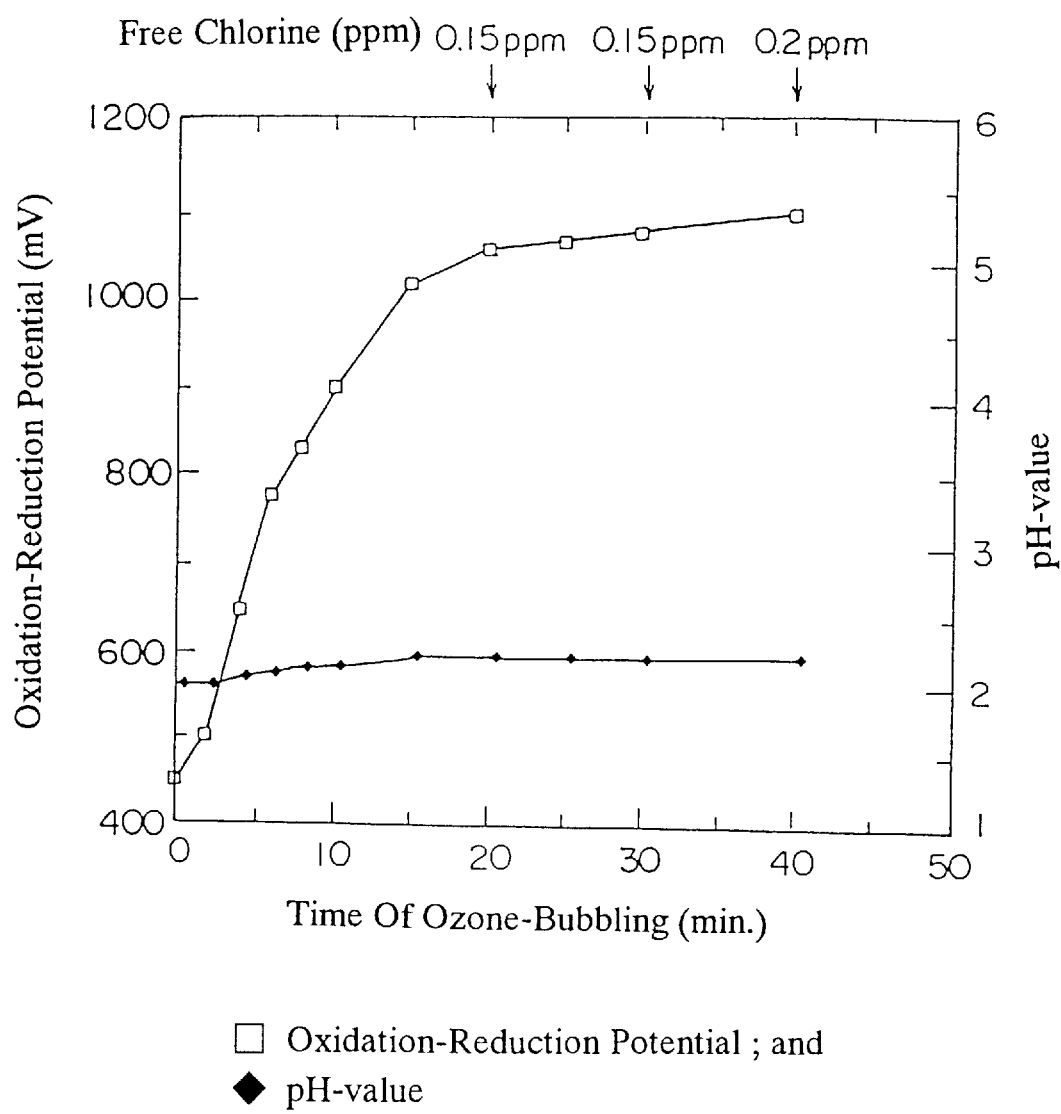
FIG. 2 is a diagram illustrative of variations both in oxidation-reduction potential and in pH-value of an improved cleaning solution over time of ozone-bubbling in accordance with the present invention.

Ultrapure water was added with a chlorine acid reagent to prepare a solution containing a chlorine acid at a concentration of $1\times10^{-2}$ moles. The solution containing the chlorine acid was then blown with ozone at 6 g/Nm$^3$ to prepare a cleaning acidic solution containing a chlorine compound acting as an oxidant. There was confirmed variations in oxidation-reduction potential and pH-value of the cleaning solution prepared over the amount of ozone supplied as illustrated in FIG. 2. The oxidation-reduction potential of the cleaning solution is raised as the concentration of chlorine in the chlorine-containing water is increased, whilst the pH-value of the cleaning solution remains almost unchanged over various amounts of ozone supplied. When the bubbling time of ozone is 10 minutes, the amount of free chlorine contained in the cleaning solution prepared is 0.1 mg/l. When the bubbling time of ozone is 20 minutes, the amount of free chlorine contained in the cleaning solution prepared is 0.15 mg/. When the bubbling time of ozone is 30 minutes, the amount of free chlorine contained in the cleaning solution prepared is 0.15 mg/. When the bubbling time of ozone is 40 minutes, the amount of free chlorine contained in the cleaning solution prepared is 0.2 mg/I. FIG. 2 demonstrates that if the bubbling time of ozone is nearly equal to or more than 10 minutes, then both conditions that the pH value is in the range of 1 to 3 and that the oxidation-reduction potential is in the range of 800 mV to 1200 mV are satisfied.

Example 3

A silicon wafer having a diameter of 150 mm was immersed into a diluted fluorine acid solution containing cupric chloride at a concentration of 0.01% by weight, followed by drying the wafer to prepare a wafer having surfaces adhered with copper. Nine of such wafers were prepared. Three of the prepared wafers were picked up for measuring the concentration of copper adhered on the surfaces of the wafer by a hydrogen fluoride vapor decomposition-atomic absorption method. The concentration of copper measured was $8.0\times10^{10}$ atoms/cm$^2$ in the average.

Ultrapure water was added with a chlorine acid to prepare a solution having a pH-value of 2 and then the solution was added with a water containing chlorine at a concentration of 0.3% by weight to prepare a cleaning solution. Of the cleaning solution prepared, oxidation-reduction potential measured was 1100 mV. Three of the silicon wafers having surfaces adhered with copper were immersed in the cleaning solution prepared for ten minutes for subsequent rinsing the silicon wafers with ultrapure water, followed by drying the rinsed silicon wafers. Of the silicon wafers cleaned, the concentration of copper remaining on the surface of the wafer was measured by the hydrogen fluoride vapor decomposition-atomic absorption method. The concentration of copper measured was not more than $2.0 \times 10^9$ atoms/$cm^2$.

5 litters of the cleaning solutions as used for cleaning the wafer was made to pass a column filled with an activated carbon and having a diameter of 5 cm and a length of 50 cm in order to measure the quality of water. Almost no oxidant was detected in the used cleaning solution. Of the used cleaning solution, the measured pH-value was 2 and the conductivity measured was 4000 $\mu$/cm. The used cleaning solution was neutralized by adding about 0.05 equivalent of alkyl to obtain a quality of water allowable to be released. This means that if sodium hydroxide is used as alkyl, then about 2 g of sodium hydroxide is necessary to neutralize the used cleaning solution.

Comparative Example 1

A chlorine acid solution containing a chlorine acid at a concentration of 37% by weight was prepared. A hydrogen peroxide solution containing hydrogen peroxide at a concentration of 30% by weight was prepared. The chlorine acid solution, the hydrogen peroxide solution and ultrapure water were mixed at a ratio by volume of 1:1:4 to prepare a cleaning solution. The cleaning solution was heated up to a temperature of 80° C. Silicon wafers having surfaces adhered with copper at a concentration of $8.0 \times 10^{10}$ atoms/$cm^2$ were prepared in the same manner as in EXAMPLE 3. Three of the silicon wafers prepared were immersed in the cleaning solution maintained at 80° C. for ten minutes. Subsequently, the three silicon wafers were also immersed but in a hot ultrapure water maintained at 80° C. for ten minutes. Thereafter, the three silicon wafers were washed with an ultrapure water maintained at ordinary temperature. The concentration of copper which remaining on the surfaces of the wafers was measured in the same manner as in EXAMPLE 3. Of the copper remaining on the surfaces of the wafers, the concentration measured was $1.1 \times 10^{10}$ atoms/$cm^2$ in the average. The cleaning solution used had an extremely low pH-value. The used cleaning solution was neutralized by adding about 8.5 equivalent of alkyl to obtain a quality of water allowable to be released. This means that if sodium hydroxide is used as alkyl, then about 340 g of sodium hydroxide is necessary to neutralize the used cleaning solution. The wasted cleaning solution has contained a large amount of hydrogen peroxide detectable as chemical oxygen demand. The large amount of hydrogen peroxide contained was reduced and decomposed by about 5.9 equivalent of reductant. This means that if sodium hydrogen sulfite is used as reductant, then about 370 g of sodium hydrogen sulfite is necessary to reduce and decompose the large amount of hydrogen peroxide.

Example 4

Of the acidic solution containing a chlorine compound acting as oxidant, the relationship between the cleaning effect and a pH-value was investigated. A silicon wafer having a diameter of 150 mm was immersed into a diluted fluorine acid solution containing cupric chloride at a concentration of 0.1% by weight, followed by drying the wafer to prepare a wafer having surfaces adhered with copper. Eighteen of such wafers were prepared. Three of the prepared wafers were picked up for measuring the concentration of copper adhered on the surfaces of the wafer by the hydrogen fluoride vapor decomposition-atomic absorption method. The concentration of copper measured was $8.0 \times 10^{10}$ atoms/$cm^2$ in the average.

Ultrapure water was added with a chlorine containing water which contains chlorine at a concentration of 0.3% by weight and further added with various amounts of a chlorine acid to prepare five kinds of cleaning solutions individually having various pH-values of 1, 2, 3, 4 and 4.5. Of the five kinds of the cleaning solutions prepared, oxidation-reduction potentials measured were in the range of 1000 mV to 1100 mV. Three of the silicon wafers having surfaces adhered with copper at a concentration of $1.0 \times 10^{12}$ atoms/$cm^2$ were immersed in the five kids of the cleaning solutions prepared for ten minutes for subsequent rinsing the silicon wafers with ultrapure water, followed by drying the rinsed silicon wafers. Of the silicon wafers cleaned, the concentration of copper remaining on the surface of the wafer was measured by the hydrogen fluoride vapor decomposition-atomic absorption method. The concentration of copper residing on the surfaces of the wafers was measured in order to find a relationship between the pH-value and the concentration of residual copper on the surfaces of the wafer. A result of the relationship between them is illustrated on Table 1.

TABLE 1

| pH-value | concentration of copper on wafer surface (atoms/$cm^2$) |
|---|---|
| 1 | $2.0 \times 10^9$ |
| 2 | $2.4 \times 10^9$ |
| 3 | $89 \times 10^9$ |
| 4 | $4.5 \times 10^{10}$ |
| 4.5 | $2.8 \times 10^{11}$ |

From Table 1, the followings can be appreciated. If the pH-value of the cleaning solution is not more than 3, then the concentration of residual copper on the of surfaces of the wafer having been cleaned is not more than $8.9 \times 10^9$ atoms/$cm^2$. If the pH-value of the cleaning solution is not more than 2, then the concentration of residual copper on the surfaces of the wafer having been cleaned is not more than $2.4 \times 10^9$ atoms/$cm^2$. If the pH-value of the cleaning solution is not more than 1, then the concentration of residual copper on the surfaces of the wafer having been cleaned is not more than $2.0 \times 10^9$ atoms/$cm^2$. This means that it is sufficient to add an acid so that the pH-value becomes about 2 and it is not necessary to add a large amount of acid.

Example 5

Of the acidic solution containing a chlorine compound acting as oxidant, the relationship between a cleaning effect and the oxidation-reduction potential measured on the basis of saturated calomel electrode was investigated. A silicon wafer having a diameter of 150 mm was immersed into a diluted fluorine acid solution containing cupric chloride at a concentration of 0.01% by weight, followed by drying the wafer to prepare a wafer having surfaces adhered with copper. Eighteen of such wafers were prepared. Three of the prepared wafers were picked up for measuring the concentration of copper adhered on the surfaces of the wafer by the hydrogen fluoride vapor decomposition-atomic absorption method. The concentration of copper measured was $9.0 \times 10^{10}$ atoms/$cm^2$ in the average.

Ultrapure water was added with a chlorine containing water which contains chlorine at a concentration of 0.3% by weight and further added with various amounts of a chlorine acid to prepare five kinds of cleaning solutions having a uniform pH-value of 2 but having various oxidation-reduction potentials of 550 mV, 720 mV, 780 mV, 840 mV and 1100 mV respectively. Three of the silicon wafers having surfaces adhered with copper at a concentration of $9.0 \times 10^{10}$ atoms/cm² were immersed in the five kinds of the cleaning solutions prepared for ten minutes for subsequent rinsing the silicon wafers with ultrapure water, followed by drying the rinsed silicon wafers. Of the silicon wafers cleaned, the concentration of copper remaining on the surface of the wafer was measured by the hydrogen fluoride vapor decomposition-atomic absorption method. The concentration of copper residing on the surfaces of the wafers was measured in order to find the relationship between the oxidation-reduction potential and the concentration of residual copper on the surfaces of the wafer. A result of the relationship between them is illustrated on Table 2.

TABLE 2

| oxidation-reduction potential (mV) | concentration of copper on wafer surface (atoms/cm²) |
|---|---|
| 550 | $1.0 \times 10^{10}$ |
| 720 | $1.0 \times 10^{10}$ |
| 780 | $5.0 \times 10^{9}$ |
| 840 | $2.9 \times 10^{9}$ |
| 1100 | less than $2.0 \times 10^{9}$ |

From Table 2, the followings can be appreciated. If the oxidation-reduction potential of the cleaning solution is 550, then the concentration of residual copper on the surfaces of the wafer having been cleaned is $1.0 \times 10^{10}$ atoms/cm². If the oxidation-reduction potential of the cleaning solution is 720, then the concentration of residual copper on the surfaces of the wafer having been cleaned is $1.0 \times 10^{10}$ atoms/cm². If the oxidation-reduction potential of the cleaning solution is 780, then the concentration of copper residual on surfaces of the wafer having been cleaned is $5.0 \times 10^{9}$ atoms/cm². If the oxidation-reduction potential of the cleaning solution is 840, then the concentration of copper residual on surfaces of the wafer having been cleaned is $2.9 \times 10^{9}$ atoms/cm². If the oxidation-reduction potential of the cleaning solution is 1100, then the concentration of copper residual on surfaces of the wafer having been cleaned is less than $2.0 \times 10^{9}$ atoms/cm². Those demonstrate that the increase in oxidation-reduction potential of the cleaning solution reduces the concentration of copper residual on surfaces of the wafer having been cleaned. If the oxidation-reduction potential of the cleaning solution is not less than 800 mV, then the concentration of copper residual on surfaces of the wafer having been cleaned is reduced to not more than $4 \times 10^{9}$ atoms/cm².

Example 6

Of the acidic solution containing a chlorine compound acting as oxidant, the relationship between the cleaning effect and the ozone bubbling effect was investigated. A silicon wafer having a diameter of 150 mm was immersed into an alkyl solution containing both ferric chloride and cupric nitrate, followed by drying the wafer to prepare a wafer having surfaces adhered with iron and copper. Eighteen of such wafers were prepared. Three of the prepared wafers were picked up for measuring the concentrations of iron and copper adhered on the surfaces of the wafer by the hydrogen fluoride vapor decomposition-atomic absorption method. The concentration of iron and copper measured was in the range of $1.0 \times 10^{11}$ atoms/cm² to $1.0 \times 10^{12}$ atoms/cm² in the average.

Ultrapure water was added with a chlorine acid at about 0.01 Mol/l to prepare a first cleaning solution having a pH-value of 2. A plurality of the silicon wafers having surfaces adhered with iron and copper at a concentration in the range of $1.0 \times 10^{11}$ atoms/cm² to $1.0 \times 10^{12}$ atoms/cm² were immersed in the first cleaning solution prepared for ten minutes. As a result, the silicon wafers adhered with iron and copper were cleaned with the diluted chlorine acid solution. A part of the silicon wafers as now immersed in the first cleaning solution is picked up for rinsing the silicon wafers with ultrapure water, followed by drying the rinsed silicon wafers.

Ultrapure water was added with a chlorine acid to prepare a cleaning solution having a pH-value of 2. The second cleaning solution was blown with an air containing ozone at about 6 g-$O_3$/Nm³ for twenty minutes to prepare a second cleaning solution having an oxidation-reduction potential of 1100 mV. The second cleaning solution was then injected into the chlorine acid solution in which the wafers were immersed thereby to replace the chlorine acid solution by the second cleaning solution blown with ozone. The wafers were immersed in the second cleaning solution blown with ozone for ten minutes. Thereafter, ultrapure water was injected into the second cleaning solution to have the second cleaning solution overflow in order to wash the wafers with ultrapure water. The wafers were then picked up to be dried.

Of the silicon wafers cleaned, the concentrations of iron and copper remaining on the surfaces of both the wafers treated with the second cleaning solution blown with ozone and treated with the chlorine acid solution free of ozone were measured by the hydrogen fluoride vapor decomposition-atomic absorption method. The concentrations of iron and copper residing on the surfaces of the wafers were measured in order to confirm an effect of the ozone blowing. A result of the ozone blowing effect is illustrated on Table 3.

TABLE 3

| concentration of copper (atoms/cm²) | concentration of copper (atoms/cm²) |
|---|---|
| $3.5 \times 10^{11}$ | $4.3 \times 10^{11}$ |
| $6.8 \times 10^{9}$ | $3.7 \times 10^{10}$ |
| $6.7 \times 10^{9}$ | $2.8 \times 10^{9}$ |

From Table 3, the followings can be appreciated. The chlorine acid solution without receiving ozone blowing can remove iron but can not remove copper. By contrast, the chlorine acid solution blown with ozone can remove not only iron but also copper.

What is claimed is:

1. A method for cleaning a solid-state material to remove organic and metallic contaminants from a surface of the solid-state material, said method comprising a single step of contacting said solid-state material with a cleaning solution which contains a chlorine compound acting as an oxidant, which has a pH value in the range of 1 to 3, and which has an oxidation-reduction potential in the range of 800 mV to 1200 mV when measured on the basis of a saturated calomel electrode at a temperature of 25° C., for a sufficient period of time to reduce the concentration of metallic and organic contaminants to a level of not more than $2 \times 10^{9}$ atoms/cm².

2. The method as claimed in claim 1, wherein said cleaning solution is prepared by blowing ozone into a chloride ion containing solution.

3. The method as claimed in claim 2, wherein said chloride ion containing solution is prepared by adding a chlorine acid to an ultrapure water.

4. The method as claimed in claim 3, wherein said chlorine acid is added to said ultrapure water at a molar ratio of $1 \times 10^{-2}$ mol/liter, and wherein said ozone is blown into said chloride ion containing solution at 6 g/Nm³ for about five minutes.

5. The method as claimed in claim 1, wherein said cleaning solution is prepared by blowing a chlorine gas into an ultrapure water.

6. The method as claimed in claim 1, wherein said cleaning solution is prepared by blowing a chlorine gas into an ultrapure water and subsequent dilution of pure water so that a concentration of chlorine is not less than 100 mg/liter.

7. The method as claimed in claim 1, wherein said cleaning solution is prepared by dissolving an oxidant of chlorine system into an ultrapure water.

8. The method as claimed in claim 7, wherein said oxidant of chlorine system is hypochlorite.

9. The method as claimed in claim 1, wherein said oxidation-reduction potential is in the range of 1000 mV to 1200 mV.

10. The method as claimed in claim 1, wherein said cleaning solution further contains at least one of inorganic acids, a hydrochloric acid and a nitric acid, provided that said cleaning solution has a pH value in the range of 1 to 3.

11. The method as claimed in claim 1, wherein said cleaning solution has a temperature in the range of room temperature to 90° C., and wherein said solid-state material is immersed into said cleaning solution for 1 to 30 minutes.

12. The method as claimed in claim 1, wherein said solid-state material is immersed into said cleaning solution applied with an ultrasonic wave.

13. The method as claimed in claim 1, further comprising a step of contacting said solid-state material with a precleaning solution which has a pH value in the range of 1 to 3 before said single step of contacting said solid-state material with said cleaning solution.

14. A method for removal of metallic and organic contaminants from a surface of a semiconductor wafer, said method comprising a single step of cleaning said semiconductor wafer with a cleaning solution which contains a chlorine compound acting as an oxidant, which has a pH value in the range of 1 to 3, and which has an oxidation-reduction potential in the range of 800 mV to 1200 mV when measured on the basis of a saturated calomel electrode at a temperature of 25° C., for a sufficient period of time to reduce the concentration of metallic and organic contaminants to a level of not more than $2 \times 10^9$ atoms/cm$^2$.

15. The method as claimed in claim 14, wherein said cleaning solution is prepared by blowing ozone into a chloride ion containing solution.

16. The method as claimed in claim 15, wherein said chloride ion containing solution is prepared by adding a chlorine acid to an ultrapure water.

17. The method as claimed in claim 16, wherein said chlorine acid is added to said ultrapure water at a molar ratio of $1 \times 10^{-2}$ mol/liter, and wherein said ozone is blown into said chloride ion containing solution at 6 g/Nm$^3$ for about five minutes.

18. The method as claimed in claim 14, wherein said cleaning solution is prepared by blowing a chlorine gas into an ultrapure water.

19. The method as claimed in claim 14, wherein said cleaning solution is prepared by blowing a chlorine gas into an ultrapure water and subsequent dilution of pure water so that a concentration of chlorine is not less than 100 mg/liter.

20. The method as claimed in claim 14, wherein said cleaning solution is prepared by dissolving an oxidant of chlorine system into an ultrapure water.

21. The method as claimed in claim 20, wherein said oxidant of chlorine system is hypochlorite.

22. The method as claimed in claim 14, wherein said oxidation-reduction potential is in the range of 1000 mV to 1200 mV.

23. The method as claimed in claim 14, wherein said cleaning solution further contains at least one of inorganic acids, a hydrochloric acid and a nitric acid, provided that said cleaning solution has a pH value in the range of 1 to 3.

24. The method as claimed in claim 14, wherein said cleaning solution has a temperature in the range of room temperature to 90° C., and wherein said semiconductor wafer is immersed into said cleaning solution for 1 to 30 minutes.

25. The method as claimed in claim 14, wherein said semiconductor wafer is immersed into said cleaning solution applied with an ultrasonic wave.

26. The method as claimed in claim 14, further comprising a step of leaning said solid-state material with a precleaning solution which has a pH value in the range of 1 to 3 before said single step of cleaning said semiconductor wafer with said cleaning solution.

\* \* \* \* \*